(12) United States Patent
Goldstein

(10) Patent No.: US 7,070,832 B2
(45) Date of Patent: Jul. 4, 2006

(54) SUBLIMATING PROCESS FOR CLEANING AND PROTECTING LITHOGRAPHY MASKS

(75) Inventor: Michael Goldstein, Ridgefield, CT (US)

(73) Assignee: Intel Corporation, Santa Clara, CA (US)

( * ) Notice: Subject to any disclaimer, the term of this patent is extended or adjusted under 35 U.S.C. 154(b) by 63 days.

(21) Appl. No.: 10/665,313

(22) Filed: Sep. 11, 2003

(65) Prior Publication Data
US 2005/0058836 A1 Mar. 17, 2005

(51) Int. Cl.
B05D 1/32 (2006.01)
(52) U.S. Cl. ............ 427/154; 427/299; 427/421.1
(58) Field of Classification Search ............ 427/421.1, 427/154, 299; 33/297; 378/34; 134/4, 42; 430/327
See application file for complete search history.

(56) References Cited

U.S. PATENT DOCUMENTS

| | | | | |
|---|---|---|---|---|
| 4,806,455 A | * | 2/1989 | LaBianca | 430/325 |
| 6,387,602 B1 | * | 5/2002 | Hayden et al. | 430/327 |
| 6,444,984 B1 | * | 9/2002 | Lundgren et al. | 250/339.03 |
| 6,619,903 B1 | * | 9/2003 | Friedman et al. | 414/331.14 |
| 6,835,503 B1 | * | 12/2004 | Krauth | 430/5 |
| 2004/0185682 A1 | * | 9/2004 | Foulke et al. | 438/800 |

OTHER PUBLICATIONS

Carbon Dioxide Snow Cleaning website; www.co2clean.com; Copyright © 1996, Applied Surface Technologies, 15 Hawthorne Drive, New Providence, NJ 07974; (908) 464-6675; fax (908) 464-7475; printed Aug. 6, 2003.

* cited by examiner

Primary Examiner—Timothy Meeks
Assistant Examiner—David Turocy
(74) Attorney, Agent, or Firm—Fish & Richardson P.C.

(57) ABSTRACT

Spraying a surface of a reticle with carbon dioxide snow cleans the surface and removes particles. Further spraying the surface of the reticle with carbon dioxide snow at a temperature below a carbon dioxide sublimation temperature forms a solid carbon dioxide layer on the surface. The solid carbon dioxide layer prevents particles from contacting the surface of the reticle. The solid carbon dioxide layer may be removed, and the reticle may be used in a extreme ultraviolet lithography tool.

10 Claims, 2 Drawing Sheets

FIG. 2A RETICLE WITH PARTICLES

FIG. 2B PARTICLE REMOVAL

FIG. 2C CLEANED RETICLE

FIG. 2D COOLING CYCLE

FIG. 2E PROTECTIVE LAYER

FIG. 2F CARRIER

SUBLIMATING PROCESS FOR CLEANING AND PROTECTING LITHOGRAPHY MASKS

BACKGROUND

A microchip manufacturing process may deposit various material layers on a wafer and form a photosensitive film or photoresist on one or more deposited layers. A lithography tool may transmit light through transmissive optics or reflect light from reflective optics to a reticle or patterned mask. Light from the reticle transfers a patterned image onto the photoresist. Portions of the photoresist which are exposed to light may be removed. Portions of the wafer which are not protected by the remaining photoresist may be etched to form transistor features.

The semiconductor industry may continue to reduce the size of transistor features to increase transistor density and improve transistor performance. This reduction in transistor feature size has driven a reduction in the wavelength of light used in lithography tools to define smaller transistor features on a photoresist.

DESCRIPTION OF DRAWINGS

FIGS. 2A–2G illustrate a technique for using carbon dioxide ($CO_2$) snow to clean and protect a reticle, which may be used with the lithography tool of FIG. 1.

DETAILED DESCRIPTION

Extreme Ultraviolet lithography (EUVL) may use a radiation wavelength of approximately 11–15 nanometers (nm). An EUV lithography tool may print a pattern on a photoresist with dimensions which are smaller than dimensions achieved by other lithography tools. An EUV lithography tool may also be called a "lithographic exposure system," an "EUV scanner" or an "EUV stepper."

Figure 1:
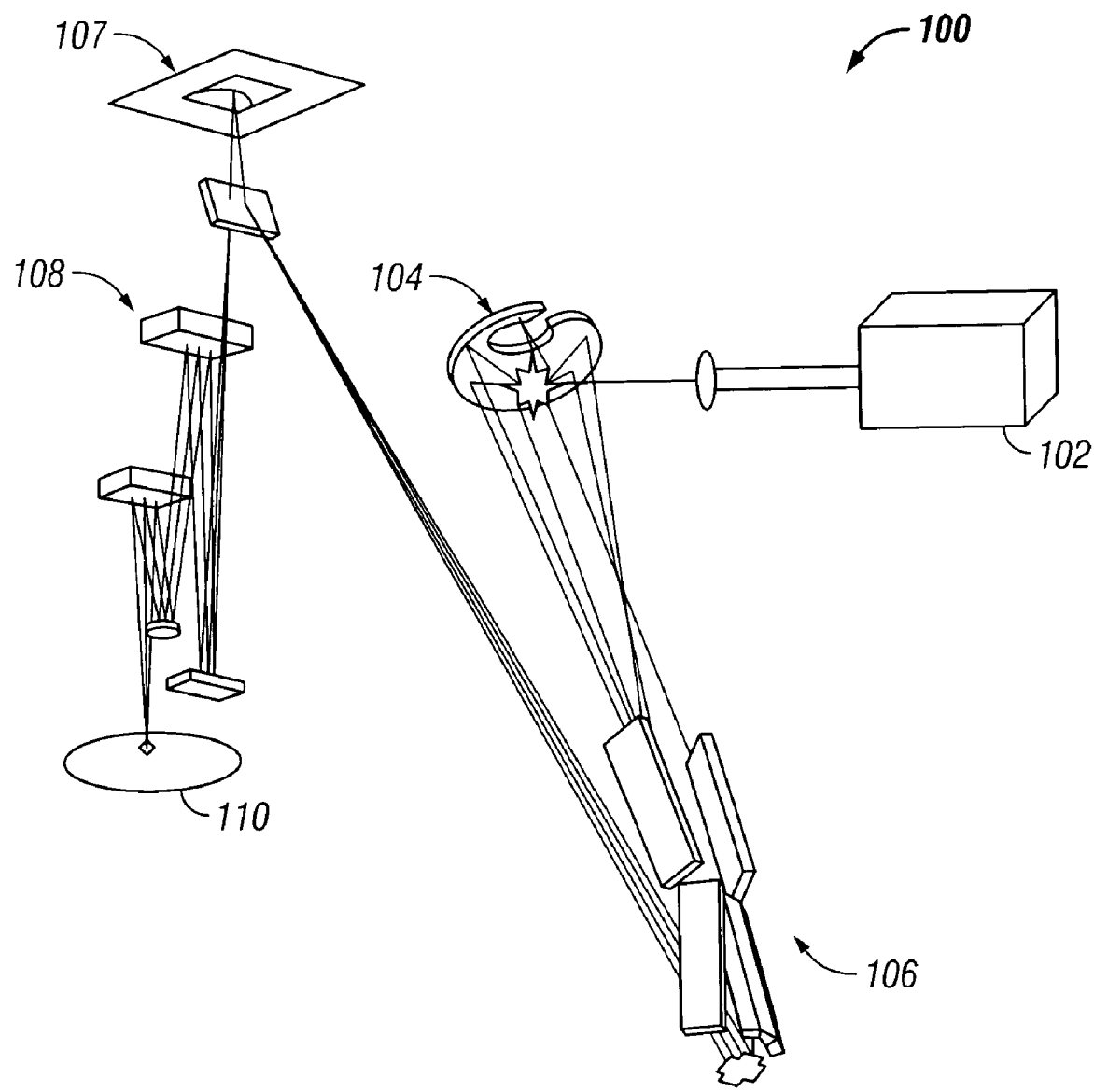
FIG. 1 illustrates an example of a lithography tool.

FIG. 1 illustrates an example of a lithography tool 100, such as an Extreme Ultraviolet lithography (EUVL) tool. The lithography tool 100 may include a laser 102, an electric discharge or laser produced plasma source 104, condenser optics 106, a reflective reticle 107 with a pattern, and reflective reduction optics 108. The laser 102 may produce radiation which reflects off the reticle 107 (also called a mask) to form a patterned image on an object 110. The object 110 may be a silicon wafer with a photoresist layer.

It may be difficult to keep a surface of the reticle 107 clean as the reticle 107 is made and transported to a site of the lithography tool 100. Handling an unprotected reticle 107 may produce particle contamination and defects on the reticle surface. As the reticle 107 is installed in the lithography tool 100, it may be difficult to protect the reticle 107 from particle contamination. A particle falling on the reticle 107 may reduce the yield for an object 110 processed by the lithography tool 100. A reticle used in an extreme ultraviolet lithography (EUVL) tool may be especially sensitive to particle contamination because EUV lithography uses very small wavelengths (11–15 nanometers). Some reticle cleaning methods, such as a liquid cleaning process, may not be suitable for use inside the lithography tool 100.

A pellicle may be designed to protect the reticle 107 from particles. But pellicle materials and adhesives may absorb extreme ultraviolet radiation and degrade after repeated exposure. The use of a removable pellicle or cover may add undesirable particle defects to the reticle 107.

The present application relates to using carbon dioxide ($CO_2$) to clean and protect a reticle. A removable $CO_2$ protective layer may be created on the reticle.

Figure 2G:
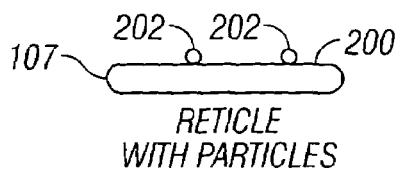
Figure 2G:
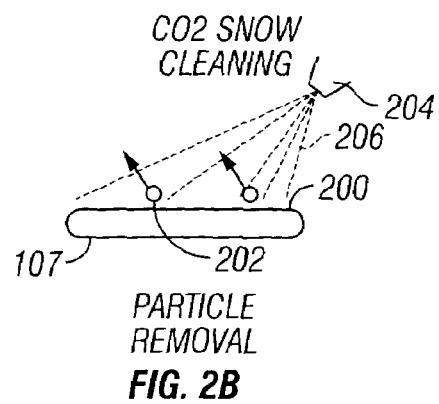
Figure 2G:
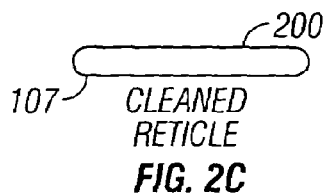
Figure 2G:
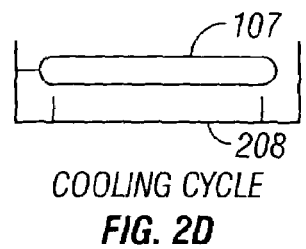
Figure 2G:
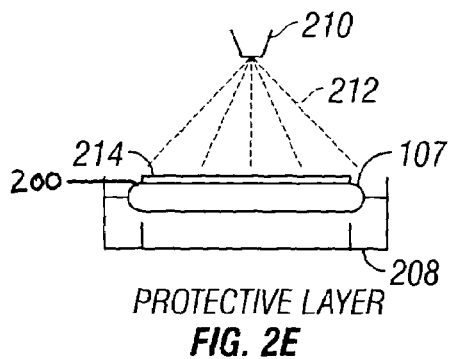
Figure 2G:
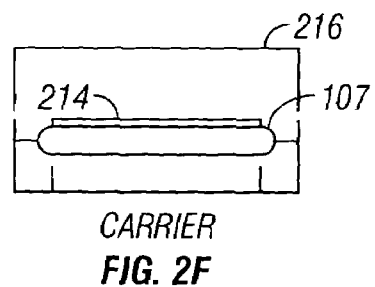
Figure 2G:
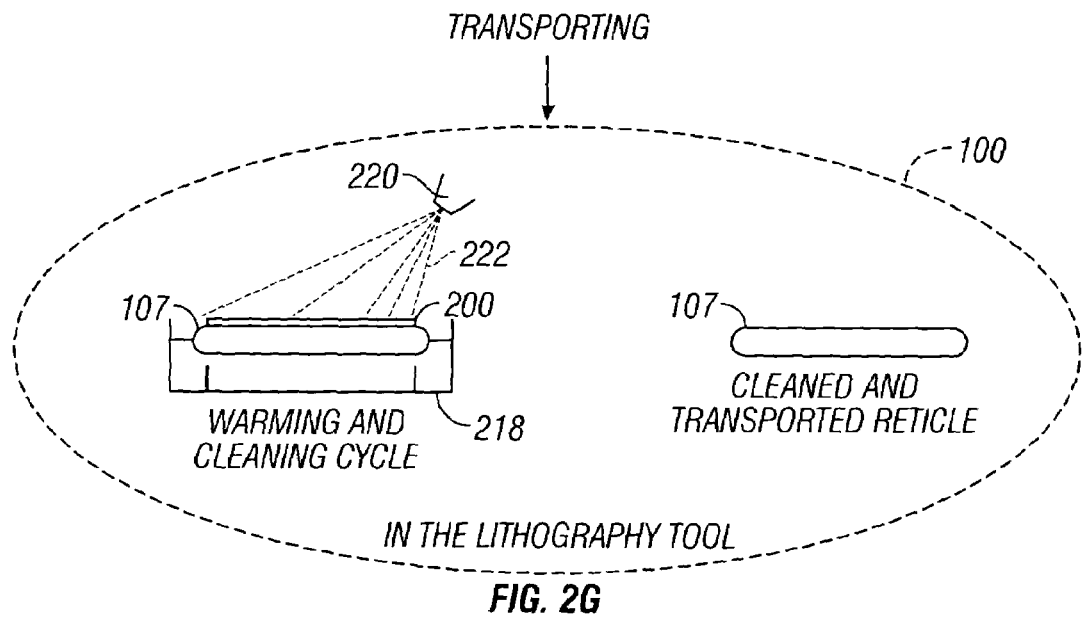

FIGS. 2A–2G illustrate a technique for using carbon dioxide ($CO_2$) snow (described herein) to clean and protect the reticle 107 of FIG. 1, such as an EUVL reticle. FIG. 2A illustrates particles 202 on a surface 200 of the reticle 107 before the reticle 107 is installed in the lithography tool 100 (FIG. 1). Particles 202 may fall on the reticle 107 during fabrication (e.g., at a "mask shop") and during handling of the reticle 107.

FIG. 2B illustrates a nozzle 204 spraying "$CO_2$ snow" 206 onto the surface 200 of the reticle 107 at a grazing angle (i.e., less than 90 degrees) to clean the reticle 107. A $CO_2$ snow cleaning device may be obtained from Applied Surface Technologies of New Providence, N.J.

"$CO_2$ snow" may be used to clean micron and sub-micron particles from sensitive optics. $CO_2$ snow cleaning may remove carbon and hydrocarbon-based contamination. There may be more than one technique of $CO_2$ snow cleaning. $CO_2$ snow cleaning may include expansion of either liquid or gaseous $CO_2$ through an orifice inside a nozzle. This expansion may lead to nucleation of small dry ice particles and a high velocity gas carrier stream. Upon impact with a dirty surface, the dry ice media may remove micron and submicron particles and hydrocarbons by momentum transfer via a transient solvent or a freeze fracture mechanism. The $CO_2$ high-velocity gas may blow the contaminants away.

The $CO_2$ snow 206 in FIG. 2B may clean the reticle surface 200 (i.e., remove particles 202) before the reticle 107 is placed in the lithography tool 100. $CO_2$ snow cleaning of the reticle 107 may be better than liquid cleaning because $CO_2$ snow cleaning may not leave a residue (e.g., chemicals) on the surface 200. $CO_2$ snow cleaning of the reticle 107 may avoid scratching or eroding the surface 200. FIG. 2C illustrates a cleaned reticle 107.

FIG. 2D illustrates a cleaned reticle 107 placed on a stage or mount 208 and subjected to a cooling cycle. The cooling cycle may use a temperature which is sufficiently low to prevent $CO_2$ in FIG. 2E from sublimating into a gas.

$CO_2$ may sublimate, i.e., change from a solid phase directly to a gas phase without a liquid phase, at a specific temperature. The sublimation temperature of $CO_2$ may be about −109.3 degrees Fahrenheit or −78.5 degrees Celsius. For example, a block of "dry ice" may sublimate from a solid to a gas.

FIG. 2E illustrates a nozzle 210 spraying $CO_2$ snow 212 onto the surface 200 of the cooled reticle 107 at a substantially normal (90-degree) angle to form a solid $CO_2$ protective layer 214. The temperature around the reticle 107 may be held sufficiently low (e.g., −109.3 degrees F. or −78.5 degrees Celsius) to maintain the solid $CO_2$ protective layer 214 and prevent $CO_2$ from sublimating into a gas. The $CO_2$ protective layer 214 may protect the reticle 107 from particle contamination as the reticle 107 is transported.

FIG. 2F illustrates a thermoelectrically-cooled carrier 216 adapted to allow the reticle 107 and its $CO_2$ protective layer 214 to be transported to a site of the lithography tool 100. The carrier 216 may maintain a temperature around the reticle 107 to prevent the $CO_2$ protective layer 214 from sublimating into a gas. After the carrier 216 and reticle 107 are transported to a site with the lithography tool 100, the carrier 216 may be removed.

FIG. 2G illustrates the reticle 107 with the $CO_2$ protective layer 214 on a stage 218 in the lithography tool 100. Before being used by the lithography tool 100, the reticle 107 may be warmed to a selected temperature (e.g., room temperature or a temperature above −109.3 degrees F. or −78.5 degrees Celsius) to sublimate the $CO_2$ protective layer 214. $CO_2$ may not leave a residue on the reticle 107 and may not damage the reticle 107.

A nozzle 220 may spray $CO_2$ or some other gas 222 at a grazing angle to clean the surface 200 of the reticle 107.

FIG. 2G illustrates the reticle 107 on the stage 218 in the lithography tool 100. The reticle 107 is cleaned and ready to be used for lithography.

In an embodiment, the techniques described above may form a $CO_2$ protective layer on a reticle, and then a pellicle may be placed over the reticle. The pellicle may be removable. The $CO_2$ protective layer may be removed inside the lithography tool 100 with or without removing the pellicle.

A number of embodiments have been described. Nevertheless, it will be understood that various modifications may be made without departing from the spirit and scope of the application. Accordingly, other embodiments are within the scope of the following claims.

What is claimed is:

1. A method comprising:
   applying carbon dioxide to a surface of a reticle;
   forming a solid carbon dioxide layer on the surface of the reticle at a temperature below a sublimation temperature of carbon dioxide, the solid carbon dioxide layer preventing particles from contacting the surface of the reticle;
   placing the reticle inside a lithography tool;
   removing the solid carbon dioxide layer from the surface of the reticle inside the lithography tool; and
   spraying the surface of the reticle with carbon dioxide inside the lithography tool.

2. The method of claim 1, wherein said applying comprises spraying the surface of the reticle with carbon dioxide and removing particles from the surface with carbon dioxide snow.

3. The method of claim 1, wherein said applying comprises spraying carbon dioxide snow at a grazing angle with respect to the surface of the reticle.

4. The method of claim 1, further comprising cooling the reticle to a temperature below a sublimation temperature of carbon dioxide before said forming a solid carbon dioxide layer on the surface of the reticle.

5. The method of claim 1, wherein said forming a solid carbon dioxide layer on the surface of the reticle comprises spraying carbon dioxide snow at a substantially 90 degree angle with respect to the surface of the reticle.

6. The method of claim 1, further comprising:
   enclosing the reticle with the solid carbon dioxide layer in a carrier; and
   maintaining a temperature around the reticle below a sublimation temperature of carbon dioxide.

7. The method of claim 1, further comprising raising a temperature around the reticle above a carbon dioxide sublimation temperature.

8. The method of claim 1, further comprising reflecting radiation off the surface of the reticle in a lithography tool.

9. The method of claim 1, further comprising reflecting extreme ultraviolet radiation off the surface of the reticle in a lithography tool.

10. A method comprising;
    spraying carbon dioxide to remove particles on a surface of a reticle;
    cooling the reticle to a temperature below a sublimation temperature of carbon dioxide;
    forming a solid carbon dioxide layer on the surface of the cooled reticle to prevent particles from contacting the surface of the reticle;
    placing the reticle inside a lithography tool;
    warming the reticle inside the lithography tool to sublimate the solid carbon dioxide layer; and
    spraying the surface of the reticle with carbon dioxide inside the lithography tool to remove particles on the surface.

* * * * *